(12) United States Patent
Fukakusa et al.

(10) Patent No.: US 11,545,770 B2
(45) Date of Patent: Jan. 3, 2023

(54) ELECTRIC-POWER CONVERSION APPARATUS

(71) Applicant: Mitsubishi Electric Corporation, Tokyo (JP)

(72) Inventors: Noriyuki Fukakusa, Tokyo (JP); Yoshifumi Mizuno, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 50 days.

(21) Appl. No.: 17/082,279

(22) Filed: Oct. 28, 2020

(65) Prior Publication Data

US 2021/0210880 A1 Jul. 8, 2021

(30) Foreign Application Priority Data

Jan. 8, 2020 (JP) .............................. JP2020-001179

(51) Int. Cl.
*H01R 12/71* (2011.01)
*H01R 12/52* (2011.01)
(Continued)

(52) U.S. Cl.
CPC ............ *H01R 12/712* (2013.01); *H01L 23/40* (2013.01); *H01R 12/523* (2013.01); *H01R 12/58* (2013.01); *H05K 1/14* (2013.01); *H05K 7/2089* (2013.01)

(58) Field of Classification Search
CPC ......... H05K 1/0201–0213; H05K 7/20; H05K 7/20218; H05K 7/20845;
(Continued)

(56) References Cited

U.S. PATENT DOCUMENTS 4,914,062 A * 4/1990 Voltz ..................... H01R 12/00
439/607.11
7,200,007 B2 * 4/2007 Yasui .................... H02M 7/003
165/80.4

(Continued)

FOREIGN PATENT DOCUMENTS

| JP | 6256675 B2 | 1/2018 |
|---|---|---|
| JP | 6452871 B1 | 1/2019 |
| WO | 2014/057622 A1 | 4/2014 |

*Primary Examiner* — Edwin A. Leon
(74) *Attorney, Agent, or Firm* — Sughrue Mion, PLLC; Richard C. Turner

(57) ABSTRACT

In the case where as a communication means among two or more control circuit boards corresponding to an on-vehicle environment, a wire harness is mounted, space-saving efficiency and assembly efficiency pose problems. When a board-to-board connector is utilized, arrangement of the control circuit boards cannot freely be performed, due to restriction of predetermined specific dimensions. An electric-power conversion apparatus includes a cooling device having a first surface, a second surface opposite to the first surface, and a hole penetrating the first surface and the second surface, a first control circuit board provided at the first surface side, a second control circuit board provided at the second surface side, and a pin header having a mold portion that partially wraps a connection pin penetrating the hole so as to connect the first control circuit board with the second control circuit board and that is fixed to the cooling device.

14 Claims, 12 Drawing Sheets

(51) Int. Cl.
  *H05K 7/20* (2006.01)
  *H01R 12/58* (2011.01)
  *H01L 23/40* (2006.01)
  *H05K 1/14* (2006.01)

(58) Field of Classification Search
  CPC ......... H05K 7/2089–2099; H05K 1/14; H01R 12/712; H01R 12/523; H01R 12/58; H01L 23/40
  See application file for complete search history.

(56) References Cited

U.S. PATENT DOCUMENTS

| | | | | |
|---|---|---|---|---|
| 7,687,715 | B2* | 3/2010 | Sano | H01R 12/7082 174/88 R |
| 9,203,170 | B2* | 12/2015 | Ozaki | H01R 12/523 |
| 9,219,425 | B2* | 12/2015 | Sano | H02M 7/003 |
| 9,419,535 | B2* | 8/2016 | Nishihara | H02M 7/003 |
| 9,704,777 | B2* | 7/2017 | Nakagawa | H01L 23/473 |
| 9,723,764 | B2* | 8/2017 | Sugita | H05K 7/20927 |
| 9,735,700 | B2* | 8/2017 | Takeuchi | H05K 7/20263 |
| 9,986,665 | B2* | 5/2018 | Kosaka | H02M 7/537 |
| 11,191,192 | B2* | 11/2021 | Takeuchi | H05K 7/20927 |
| 2001/0014029 | A1* | 8/2001 | Suzuki | H05K 7/20927 363/141 |
| 2015/0064974 | A1 | 3/2015 | Ozaki et al. | |
| 2019/0244874 | A1* | 8/2019 | Yoshikawa | H05K 7/209 |
| 2019/0269031 | A1 | 8/2019 | Ishibashi et al. | |

* cited by examiner

ELECTRIC-POWER CONVERSION APPARATUS

BACKGROUND

Field of the Technology

The present disclosure relates to an electric-power conversion apparatus.

Description of the Related Art

As a driving power source of a vehicle, an electric motor is utilized. When an electric motor is driven by an alternating current, an electric-power conversion apparatus including an inverter, a converter, and the like is mounted in a vehicle, in order to convert a direct current supplied by a DC power source such as a battery into an alternating current. There exists a case where two or more control circuit boards are mounted in an inverter, due to increase in the output and in the number of functions of an electric-power conversion apparatus.

There has been disclosed a configuration in which a semiconductor module is mounted on the top surface of a heat sink having cooling fins, two or more control circuit boards are arranged on the semiconductor module in such a way as to be spaced a predetermined distance apart from one another, and the control circuit boards are electrically connected with one another through wire harnesses (e.g., refer to Patent Literature 1).

Moreover, there has been disclosed a configuration in which respective semiconductor modules are mounted above the both surfaces of a heat sink having cooling fins, and a control circuit board provided above the top-surface-side semiconductor module and a control circuit board provided beneath the bottom-surface-side semiconductor module are electrically connected with each other by use of wire harnesses arranged in such a way as to penetrate the heat sink (e.g., refer to Patent Literature 2).

Moreover, there has been disclosed a configuration in which two or more control circuit boards are arranged in such a way as to be spaced a predetermined distance apart from one another in the thickness direction of the board, both the boards are connected by use of a board-to-board connector or a pin header (e.g., refer to Patent Literature 3).

PRIOR ART REFERENCE

Patent Literature

[Patent Literature 1] WO 2014/057622 A
[Patent Literature 2] JP 6452871 B
[Patent Literature 3] JP 6256675 B

SUMMARY OF THE DISCLOSURE

In the case where there is mounted a wire harness, as a means, for connecting two or more control circuit boards, that conforms to the environment of a vehicle on which external force such as vibration, impact, or the like act, connection is performed through the intermediary of a connector; thus, a wiring-work space of a specific area or more, including the end portion of the board, is required. Moreover, in order to prevent traveling vibration of an automobile from making the wire harness make contact with a case to be disconnected, it is required to secure a clearance of a specific distance or more from the case; alternatively, a contrivance such as covering the wire harness with a protection member is required. Accordingly, there has been a case where it is difficult to realize a small-size, space-saving electric-power conversion apparatus. Still moreover, there has been a problem that depending on the layout in an electric-power conversion apparatus, there exists a case where in the connector portion of a wire harness, work of fitting a male connector with a female connector is difficult or work of confirming the fitting state is difficult.

As Patent Literature 3, there exists a method in which two or more control circuit boards are arranged in such a way as to be spaced a predetermined distance apart from one another and both the boards are connected by use of a board-to-board connector or a pin header. In this case, the thickness-direction distance between the two control circuit boards is limited to a specific dimension determined by the shape of the board-to-board connector and hence no free arrangement of the control circuit boards can be performed. Moreover, there exists a pin header whose positioning portion is inserted or press-fitted into a control circuit board and whose signal-terminal tip is connected with the control circuit board through soldering; in the case where the distance between the control circuit boards is large, a problem is posed about the efficiency in inserting the signal terminal into the control circuit board.

The objective of the present disclosure is to provide an electric-power conversion apparatus that raises the space-saving efficiency and the degree of flexibility in setting the distance between control circuit boards and that can raise the assembly efficiency.

An electric-power conversion apparatus disclosed in the present disclosure includes
- a cooling device having a first surface, a second surface opposite to the first surface, and a hole that penetrates a portion thereof between the first surface side and the second surface side,
- a first control circuit board provided at the first surface side of the cooling device,
- a second control circuit board provided at the second surface side of the cooling device, and
- a pin header having a connection pin that penetrates the hole so as to connect the first control circuit board with the second control circuit board and a mold portion that is fixed to the cooling device and partially wraps the connection pin.

In the electric-power conversion apparatus disclosed in the present disclosure, the respective control circuit boards mounted on the both surfaces of the cooling device can be connected with each other at a shortest distance; thus, a space-saving electric-power conversion apparatus can be provided. Moreover, when the both boards are connected with each other through the intermediary of the pin header, a signal terminal of the pin header fixed to the cooling device is connected with the control circuit board, so that the degree of flexibility in setting the distance between the control circuit boards and the assembly efficiency are raised.

The foregoing and other object, features, aspects, and advantages of the present disclosure will become more apparent from the following detailed description of the present disclosure when taken in conjunction with the accompanying drawings.

DETAILED DESCRIPTION OF THE PREFERRED EMBODIMENTS

Hereinafter, Embodiments of an electric-power conversion apparatus according to the present disclosure will be explained with reference to the drawings.

1. Embodiment 1

Figure 1:
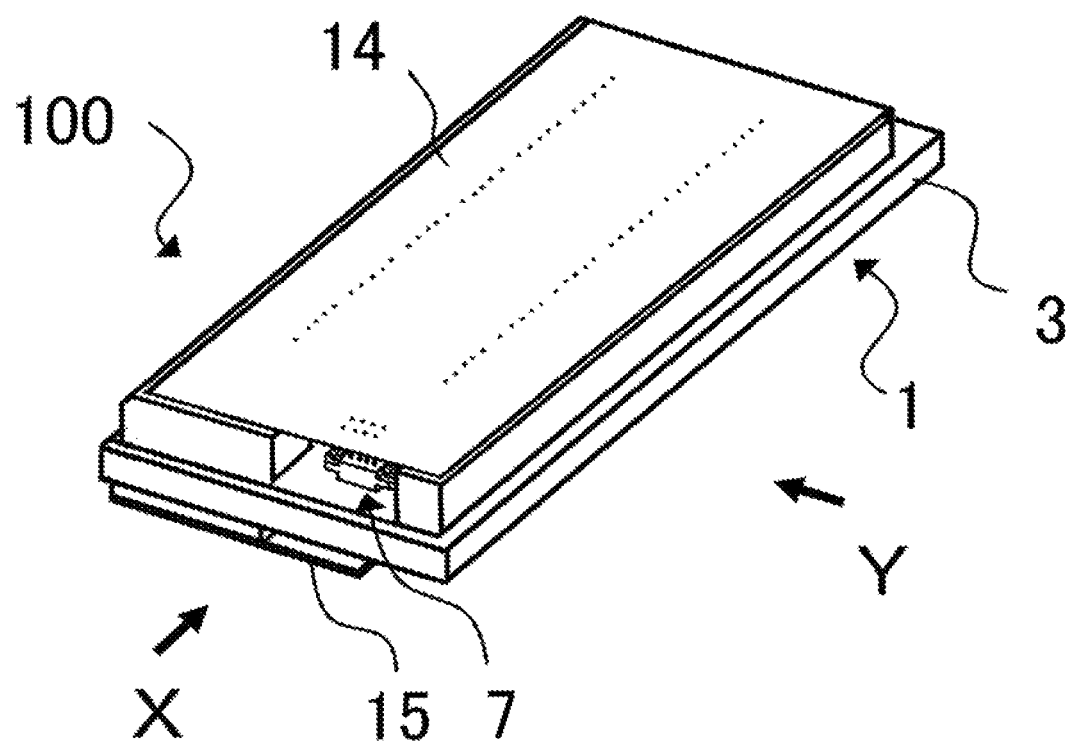
FIG. 1 is a perspective view of an electric-power conversion apparatus according to Embodiment 1.
Figure 2:
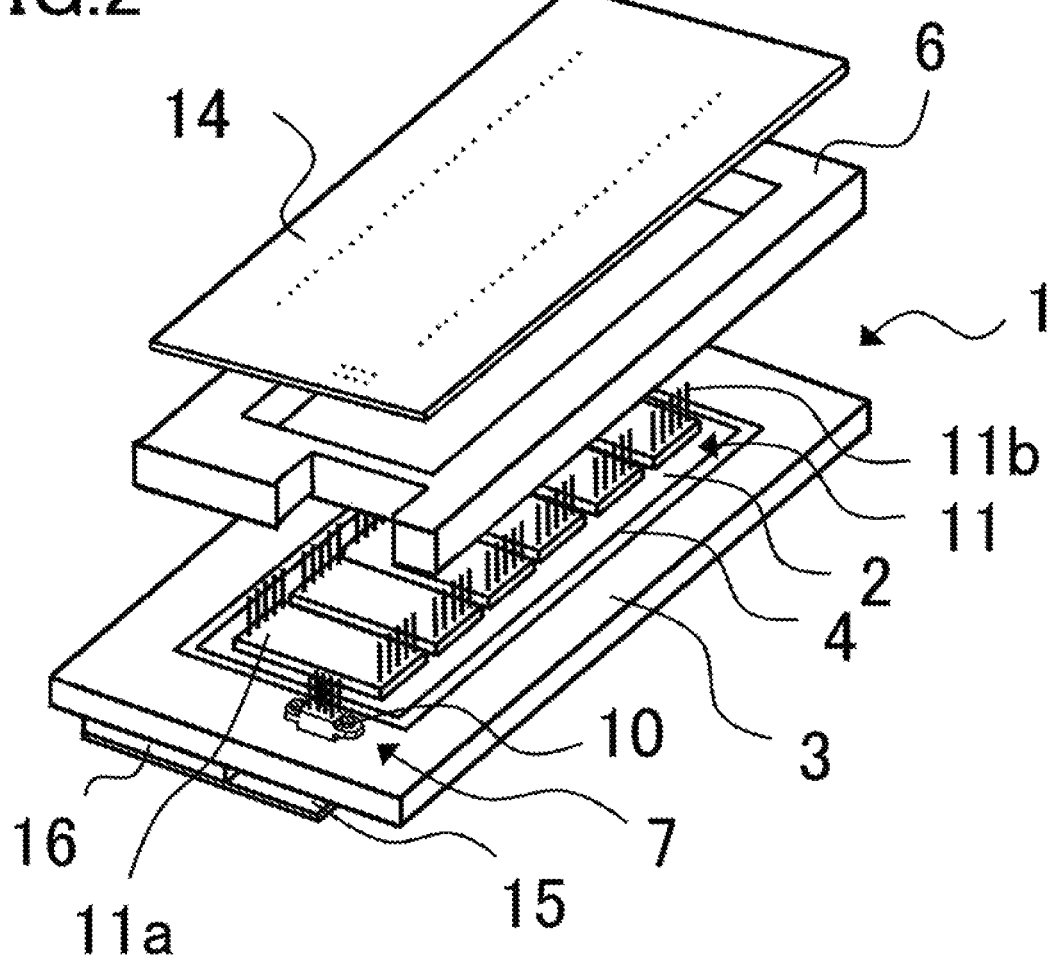
FIG. 2 is a perspective view of an assembling state of the electric-power conversion apparatus according to Embodiment 1.
Figure 3:
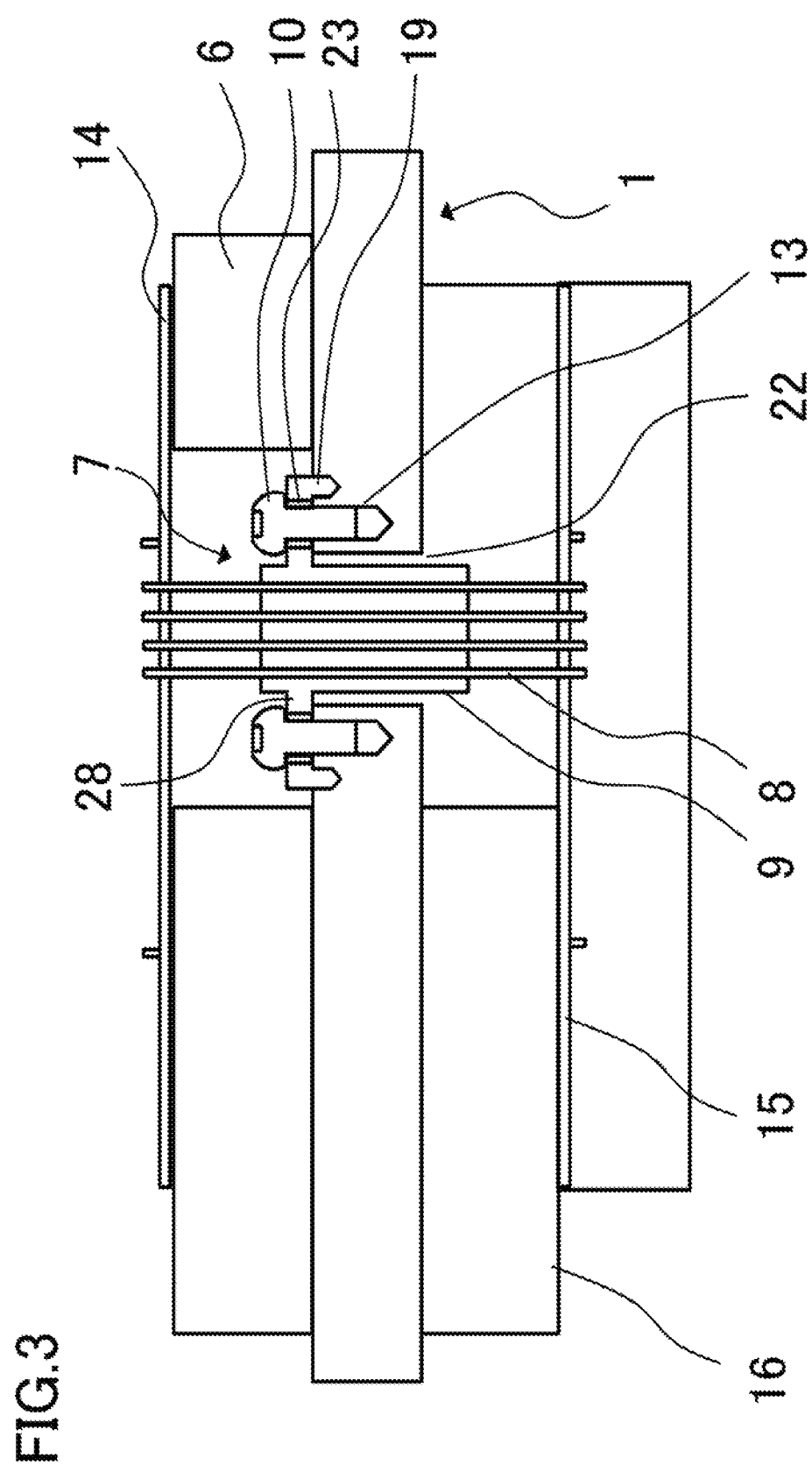
FIG. 3 is a cross-sectional view of the electric-power conversion apparatus according to Embodiment 1, when viewed in a front direction.
Figure 4:
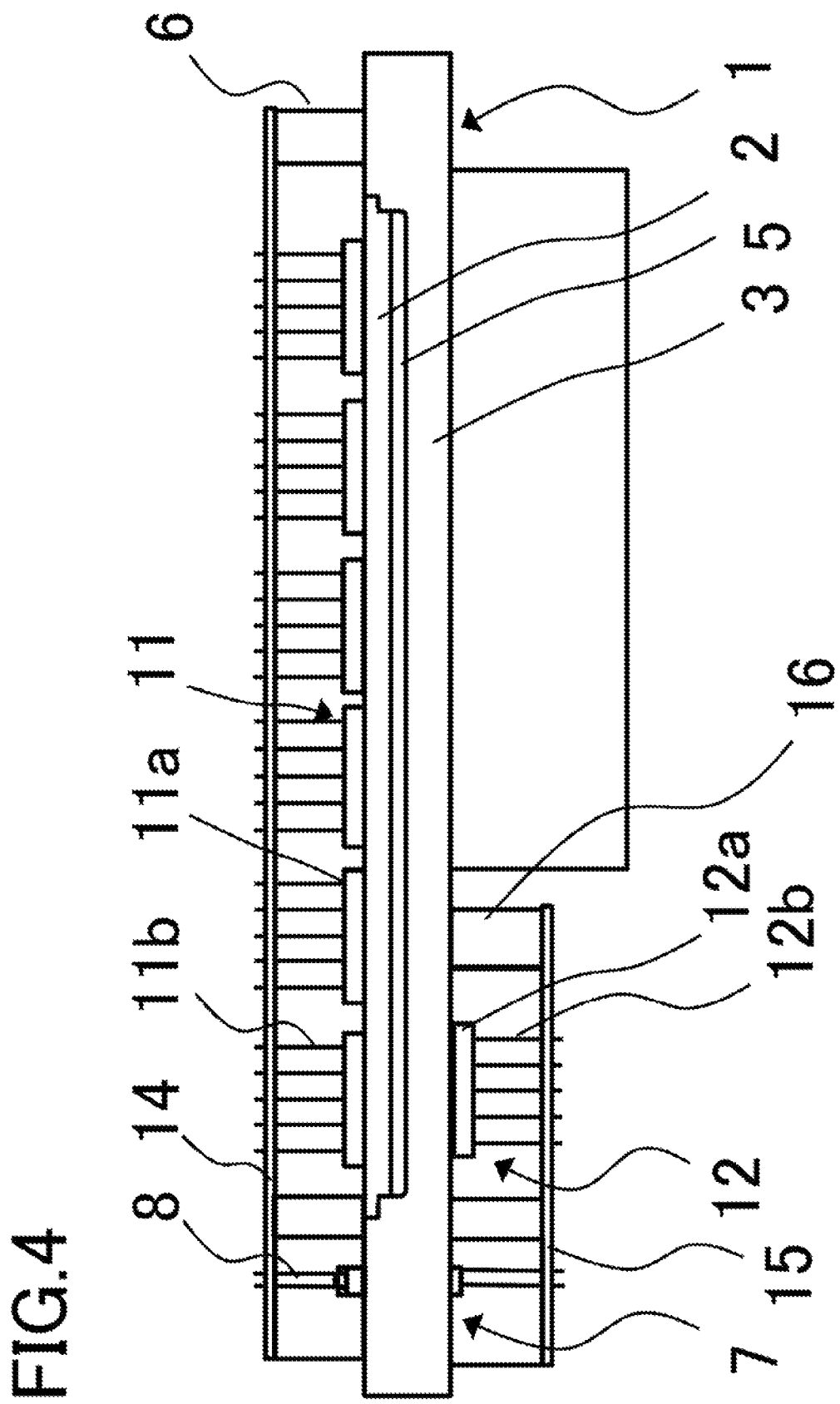
FIG. 4 is a cross-sectional view of the electric-power conversion apparatus according to Embodiment 1, when viewed in a side direction.
Figure 5:
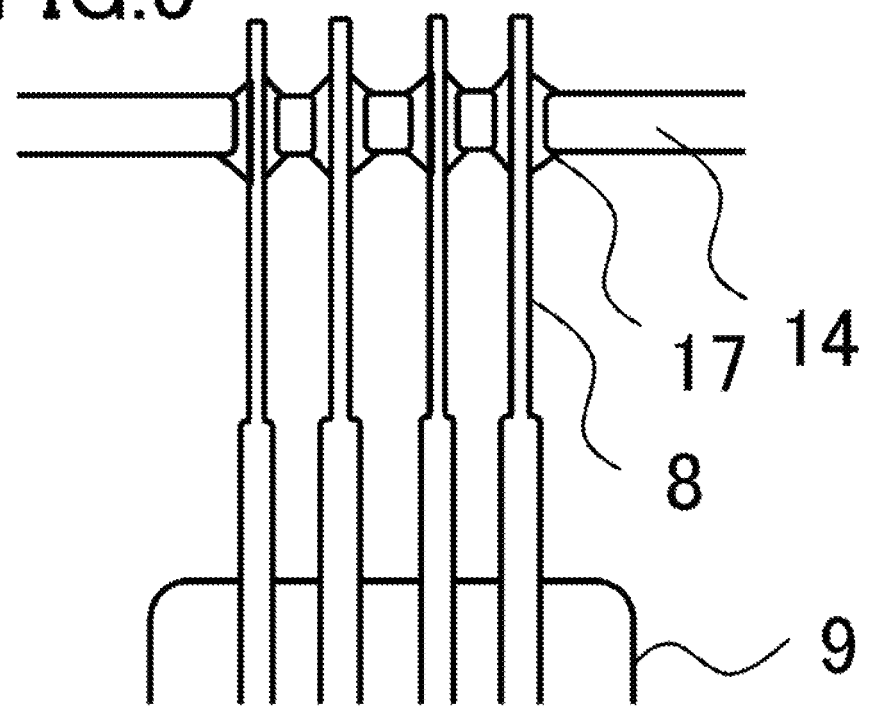
FIG. 5 is a cross-sectional view illustrating a state where a signal terminal of a pin header and a control circuit board are soldered with each other in the electric-power conversion apparatus according to Embodiment 1.
Figure 6:
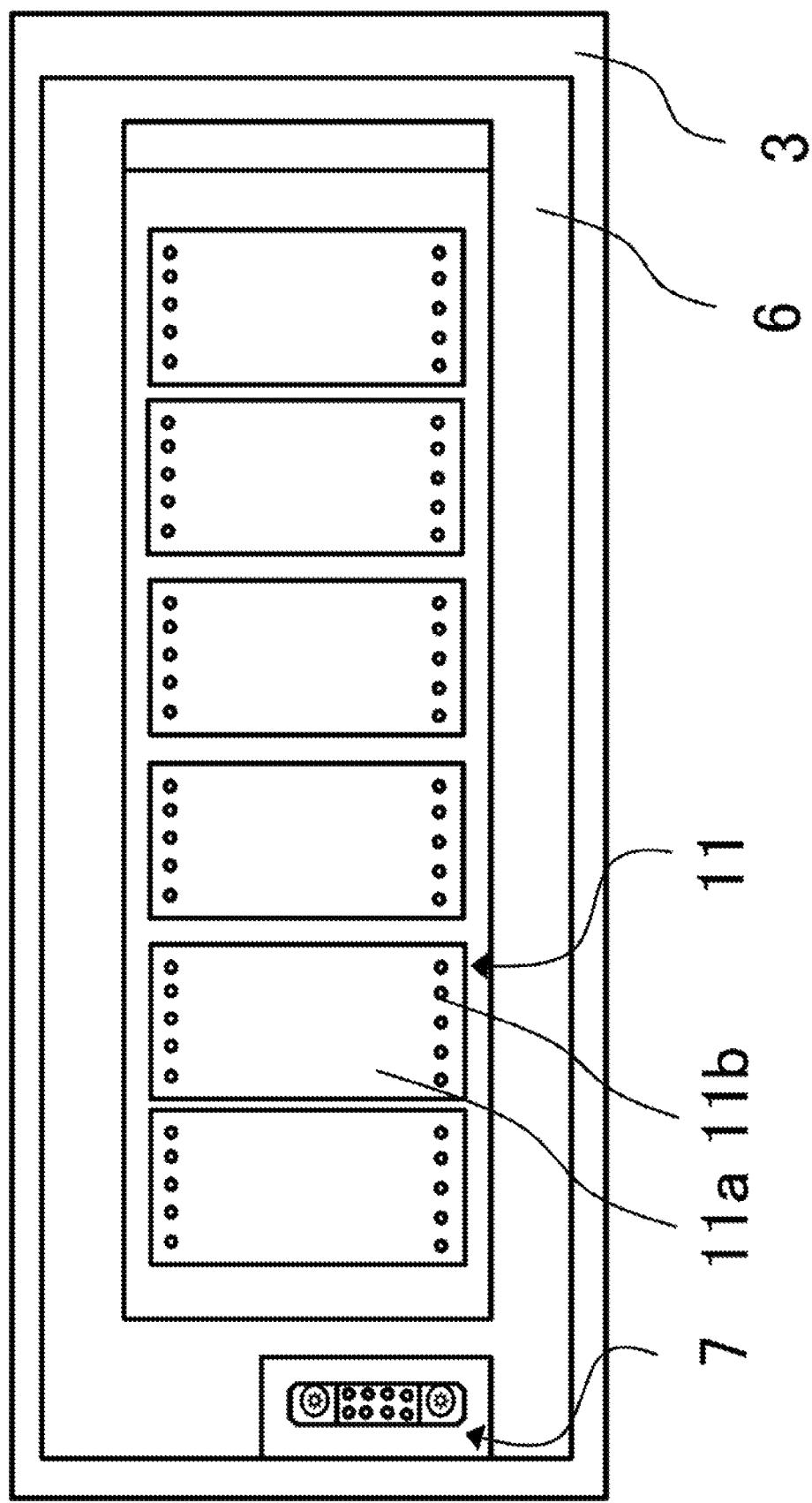
FIG. 6 is a top view of the electric-power conversion apparatus according to Embodiment 1, at a time before a first control circuit board is provided.
Figure 7:
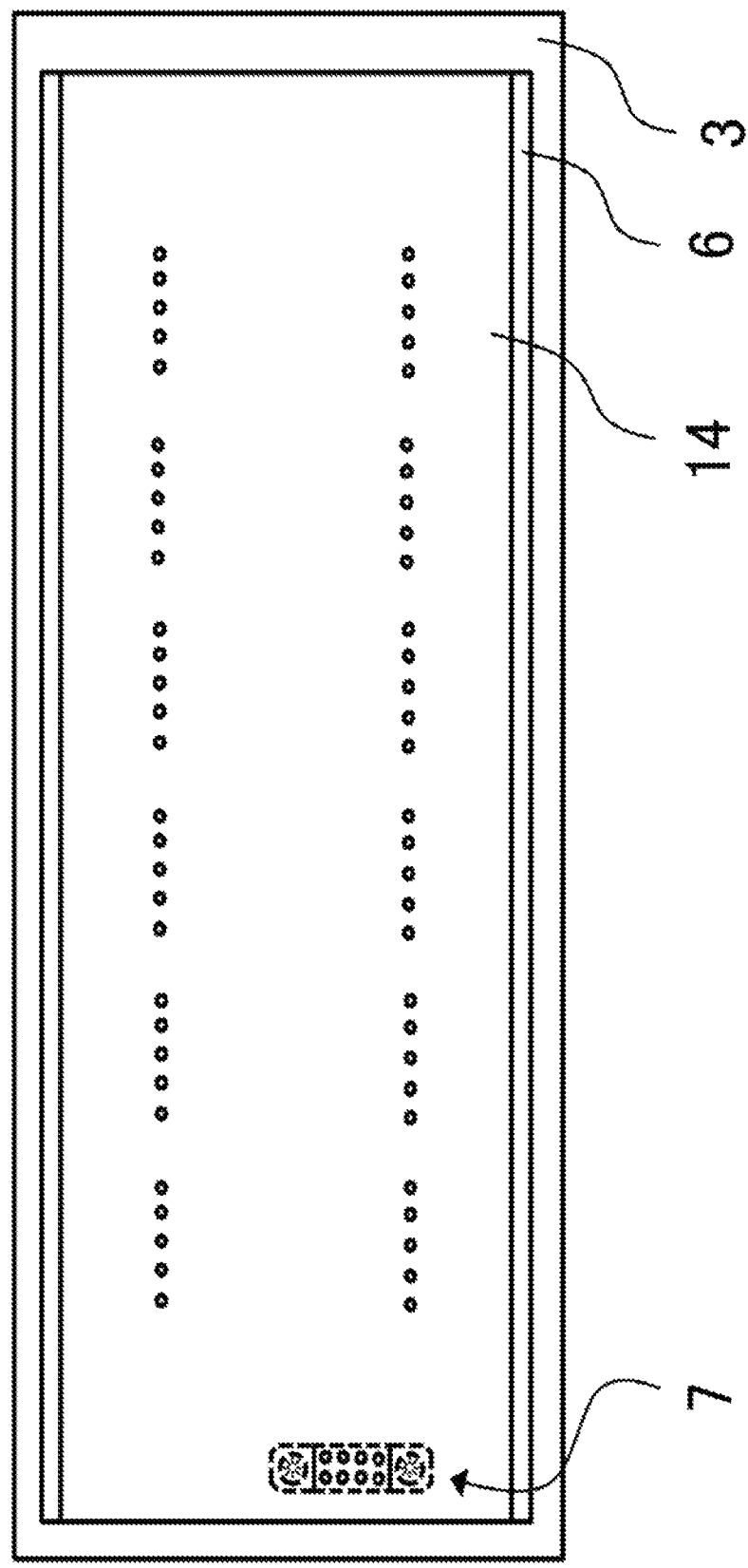
FIG. 7 is a top view of the electric-power conversion apparatus according to Embodiment 1, at a time after the first control circuit board has been provided.

FIG. 1 is a perspective view of an electric-power conversion apparatus 100 according to Embodiment 1. FIG. 2 is a perspective view of an assembling state of the electric-power conversion apparatus 100 according to Embodiment 1. FIG. 3 is a cross-sectional view of the electric-power conversion apparatus 100 according to Embodiment 1, when viewed in a front direction; a cross-sectional view thereof taken at the position of a pin header 7 is illustrated. The front direction is indicated by an arrow X in FIG. 1. FIG. 4 is a cross-sectional view of the electric-power conversion apparatus 100 according to Embodiment 1, when viewed in a side direction; a cross-sectional view thereof taken at a position in front of the pin header 7 is illustrated. The side direction is indicated by an arrow Y in FIG. 1. FIG. 5 is a cross-sectional view illustrating a state where a connection pin 8 of the pin header 7 and a first control circuit board 14 are soldered with each other in the electric-power conversion apparatus 100 according to Embodiment 1. FIG. 6 is a top view of the electric-power conversion apparatus according to Embodiment 1, at a time before the first control circuit board 14 is provided. FIG. 7 is a top view of the electric-power conversion apparatus according to Embodiment 1, at a time after the first control circuit board 14 has been provided.

Electric-Power Conversion Apparatus

In a vehicle, the electric-power conversion apparatus 100 illustrated in FIG. 1 converts a direct current supplied from a battery into an alternating current by use of an inverter, in order to drive an electric motor, and converts an alternating current generated by an electric power generator into a direct current, in order to charge the battery. In addition, in order to perform energy conversion between a low-voltage battery and a high-voltage battery, voltage conversion is performed by use of a step-up converter and a step-down converter.

Because in the electric-power conversion apparatus 100, the inverter and the converter for converting electric power are driven, circuit components in the inverter and the converter generate heat. Accordingly, a cooling device 1 for cooling the circuit components is provided; the cooling device 1 cools the circuit components in order to suppress temperature rises in the circuit components, so that the small-size, high-density electric-power conversion apparatus 100 can efficiently be driven.

The cooling device 1 is configured to be suitable for the electric-power conversion apparatus 100 to be mounted in a vehicle and is provided with mechanical strength to withstand vibration of the vehicle and with space-saving efficiency. It goes without saying that the electric-power conversion apparatus 100 can be utilized in other applications than usage in a vehicle. Although the description is omitted in FIG. 1, there exist electric components such as a smoothing capacitor and a step-up reactor in the electric-power conversion apparatus 100, and there are mounted terminal platforms and the like for connecting the smoothing capacitor, the step-up reactor, and the like with a first semiconductor module 11 and a second semiconductor module 12.

Semiconductor Module and Control Circuit Board

As illustrated in FIGS. 2 and 4, a base 2 is stacked on the top surface of a cooling device base portion 3 of the cooling device 1; through the intermediary of a bonding portion 4, the base 2 and the cooling device base portion 3 are integrated with each other through FSW (Friction Stir Welding). A refrigerant flow path 5 is formed between the base 2 and the cooling device base portion 3; a refrigerant is introduced and exhausted through pipe portion (unillustrated). The refrigerant cools the cooling device 1, so that the first semiconductor module 11 disposed on the top surface of the base 2 and the second semiconductor module 12 disposed on the bottom surface of the cooling device base portion 3 are cooled.

Power semiconductor components forming the inverter, the converter, electronic relay, and the like of the electric-power conversion apparatus 100 are incorporated in each of the first semiconductor module 11 and the second semiconductor module 12. The first semiconductor module 11 includes a first main body 11a and a first connection terminal 11b that extends upward from the first main body 11a so as to connect the first main body 11a with the first control circuit board 14. By way of the first connection terminal 11b, a control signal for controlling the first semiconductor module 11, signals for indicating a current to be supplied to the first semiconductor module 11, a current to be supplied by the first semiconductor module 11, and the temperature, the operation state, and an abnormality state of the first semiconductor module 11, and the like are transferred.

FIG. 4 illustrates that similarly, a second connection terminal 12b extends downward from a second main body 12a of the second semiconductor module 12 disposed on the bottom surface of the cooling device base portion 3 so that the second main body 12*a* is electrically connected with a second control circuit board 15. As is the case with the first semiconductor module 11, the second semiconductor module 12 incorporates a power semiconductor, and various kinds of signals and currents are transferred through the second connection terminal 12*b*.

Pin Header

As illustrated in FIG. 3, the first control circuit board 14 and the second control circuit board 15 are electrically connected with each other through the connection pin 8 of the pin header 7. The pin header 7 has a structure in which a resin-made mold portion 9 surrounds the middle portions of the connection pins 8; the pin header 7 is mounted to the cooling device 1 through the intermediary of a mold flange portion 28. The pin header 7 is disposed in such a way as to penetrate a hole 22 provided in the cooling device 1; the mold flange portion 28, having a mold mounting hole 23, of the pin header 7 is fixed to the cooling device 1 with a screw 10 inserted into the mold mounting hole 23. The connection pin 8 of the pin header 7 is disposed to be perpendicular to the cooling device 1. The pin header 7 can be produced in such a way that after the mold portion 9 is molded, the connection pin 8 is press-fitted into the mold portion 9; however, the pin header 7 can also be produced through the insert molding method in which after the connection pin 8 is fixed at a predetermined position in a die, resin is inserted around the connection pin 8 so as to mold the mold portion 9.

The pin header 7 secures the electric connection between the first control circuit board 14 and the second control circuit board 15; thus, in comparison with the case where connection is performed by use of a connector and a wire harness, neither wiring-work space nor clearance from the case is required and hence the electric-power conversion apparatus 100 can be downsized. Moreover, because no work of fitting connectors together is required, the working efficiency in the assembly can be raised. In addition, because in comparison with the combination of a wire harness and a connector, the pin header 7 requires a fewer number of components, the cost of components is reduced.

Moreover, in the case where connection is performed by use of a conventional board-to-board connector, it is not made possible to flexibly deal with a change in the distance between the first control circuit board 14 and the second control circuit board 15; in contrast, in the case of the pin header 7 according to Embodiment 1, a change in the distance between the first control circuit board 14 and the second control circuit board 15 can be dealt with only by changing the length of the connection pin 8, without changing any of the dimension and the shape of the mold portion 9. In addition, because in the case where connection is performed by use of a board-to-board connector and the distance between the first control circuit board 14 and the second control circuit board 15 is large, the variations in the positions of the terminals of the connector become large; therefore, when the board-to-board connector is fixed to one of the control circuit boards, a problem is posed about the efficiency in inserting the signal terminal into the other one of the control circuit boards. In contrast, in the case where the pin header 7 according to Embodiment 1 is utilized, it is only necessary to consider the variations in the distance corresponding to the half of the length of the connection pin 8, i.e., the variations in the length corresponding to the half of the distance between the first control circuit board 14 and the second control circuit board 15, because the pin header 37 is fixed to the cooling device 1 situated at a position that is the middle of the distance between the first control circuit board 14 and the second control circuit board 15. Accordingly, when the pin header 7 is utilized, the effect of the variations in the connection pins is not likely to be provided in comparison with the case where a board-to-board connector is utilized.

The pin header 7 is fixed to the cooling device 1 through the intermediary of the mold flange portion 28 provided in the mold portion. Because the mold flange portion 28 makes it possible to accurately provide the pin header 7 in the cooling device 1, the assembly efficiency of each of the first control circuit board 14 and the second control circuit board 15 can be raised. Moreover, it is also advantageous that because the pin header 7 is fixed to the cooling device 1 through the intermediary of the mold flange portion 28, various changes in the distance between the first control circuit board 14 and the second control circuit board 15 and in the number of the connection pins to be used can be dealt with by changing the lengths and the number of the connection pins 8, without changing the respective shapes of the mold flange portion 28 and the installation accepting portion, for the mold flange portion 28, of the cooling device 1.

Positioning of Pin Header

A mold protrusion 19 for positioning is provided in the mold flange portion 28 of the pin header 7; the mold protrusion 19 is inserted into a positioning hole in the cooling device 1 so that the pin header 7 is fixed within a prescribed dimension-variation range. In addition, as the positioning mechanism for the pin header 7, it may be allowed that a positioning hole is provided in the mold portion 9 and a positioning protrusion is provided in the cooling device 1.

It is significant that because in order to determine the position at which the pin header 7 is fixed to the cooling device 1, the mold protrusion 19 is provided in the mold flange portion 28, the positioning can accurately and readily be performed. Because the respective positons of the pin header 7 and the cooling device 1 are accurately set, the connection pin 8 of the pin header 7 can readily be connected with the first control circuit board 14 and the second control circuit board 15.

It may be allowed that the positioning of the pin header 7 in the cooling device 1 is performed not by the protrusion of the mold flange portion 28 but by the mold mounting hole 23 and a screw hole 13 in the cooling device 1. It may be allowed that fixing the pin header 7 to the cooling device 1 is performed not by the screw 10 but through snap fitting or by press-fitting the mold portion 9 into the hole 22.

Tip Position of Connection Pin

FIG. 5 illustrates a state where the tip portion of the connection pin 8 of the pin header 7 is fixed to the first control circuit board 14 with solder 17. In FIG. 4, the tip, at the first control circuit board 14 side, of the connection pin 8 of the pin header 7 and the tip of the first connection terminal 11*b* of the first semiconductor module 11 are aligned at the same height. That is to say, there is illustrated the state where the tip portion, at the first control circuit board 14 side, of the connection pin 8 and the tip portion of the first connection terminal 11*b* of the first semiconductor module 11 are arranged on one and the same plane parallel to the first control circuit board 14. Arrangement of the tip portions in such a manner as described above facilitates insertion of the connection pin 8, at the first control circuit board 14 side, of the pin header 7 and the first connection terminal 11*b* of the first semiconductor module 11 into the respective through-holes in the first control circuit board 14; thus, the insertion process can be performed by a single movement and hence the assembly time can be shortened.

As illustrated in FIGS. 4 and 5, the tip, at the first control circuit board 14 side, of the connection pin 8 of the pin header 7 and the tip of the first connection terminal 11*b* of the first semiconductor module 11 penetrate the respective through-holes in the first control circuit board 14 and then are fixed thereto with the solder 17. Accordingly, each of the connection pin 8 of the pin header 7 and the first connection terminal 11*b* of the first semiconductor module 11 is securely connected and fixed. Connection through soldering facilitates the assembly, makes it possible to reduce the assembling cost, and makes it possible to omit the assembling process, such as wire-harness connection, that requires proficiency of a worker. Because being a relatively low-cost and high-reliability connection method, soldering is advantageous.

However, in addition to making the connection pin 8 and the first connection terminal 11*b* penetrate the respective through-holes in the first control circuit board 14, it may be allowed that push-in-type connectors are provided in connection portions of the first control circuit board 14 and then the tip, at the first control circuit board 14 side, of the connection pin 8 and the tip of the first connection terminal 11*b* of the first semiconductor module 11 are connected with the respective corresponding connection portions through the push-in method. Moreover, it may be allowed that the tip, at the first control circuit board 14 side, of the connection pin 8 and the tip of the first connection terminal 11*b* of the first semiconductor module 11 are soldered to the first control circuit board 14 through surface mounting.

In FIGS. 4 and 5, the tip, at the first control circuit board 14 side, of the connection pin 8 and the tip of the first connection terminal 11*b* of the first semiconductor module 11 have been explained. Similarly, when being arranged on one and the same plane parallel to the second control circuit board 15, the tip portion, at the second control circuit board 15 side, of the connection pin 8 and the tip portion of the second connection terminal 12*b* of the second semiconductor module 12 are readily inserted into respective through-holes in the second control circuit board 15; thus, the insertion process can be performed by a single movement and hence the assembly time can be shortened.

The tip, at the second control circuit board 15 side, of the connection pin 8 of the pin header 7 and the tip of the second connection terminal 12*b* of the second semiconductor module 12 penetrate the respective through-holes in the second control circuit board 15 and then are fixed thereto with the solder 17. Accordingly, each of the connection pin 8 of the pin header 7 and the second connection terminal 12*b* of the second semiconductor module 12 is securely connected and fixed. Because being a relatively low-cost and high-reliability connection method, soldering is advantageous. In addition, as is the case with the first control circuit board 14, also with regard to the second control circuit board 15, it is made possible that connection with the second control circuit board 15 is performed not through soldering to the through-hole but by providing a push-in-type connector in a connection portion or by soldering through surface mounting.

Selection of Material

Because in the connection between the control circuit boards by use of the pin header 7, the connection pin 8, which is a rigid body, unlike the wire harness, is utilized for the connection, the difference in the linear-expansion coefficient of each of the materials of the respective components of the electric-power conversion apparatus may cause an excessive stress to be applied to a soldering portion. A first linear-expansion coefficient $\alpha 1$, which is the linear-expansion coefficient of the connection pin 8 in the pin header 7, a second linear-expansion coefficient $\alpha 2$, which is the linear-expansion coefficient of the mold portion 9 made of resin, and a third linear-expansion coefficient $\alpha 3$, which is the linear-expansion coefficient of the cooling device 1, will be described. When the materials are selected in such a way that the linear-expansion coefficient ratios $\alpha 1/\alpha 2$ and $\alpha 2/\alpha 3$ are 0.8 or larger and 1.2 or smaller, respectively, thermal stress caused by a temperature change can be prevented from deteriorating the pin header 7 when the electric-power conversion apparatus is utilized in a vehicle that is exposed to the low-temperature environment where the outdoor temperature is −40° C. or lower and to the high-temperature environment where the outdoor temperature is 85° C. or higher. Because the electric-power conversion apparatus is exposed also to a temperature rise caused by self-heating, it is desirable to select the materials in such a way that the difference between the linear-expansion coefficient ratios falls within ±20%.

Location of Pin Header

Figure 8:
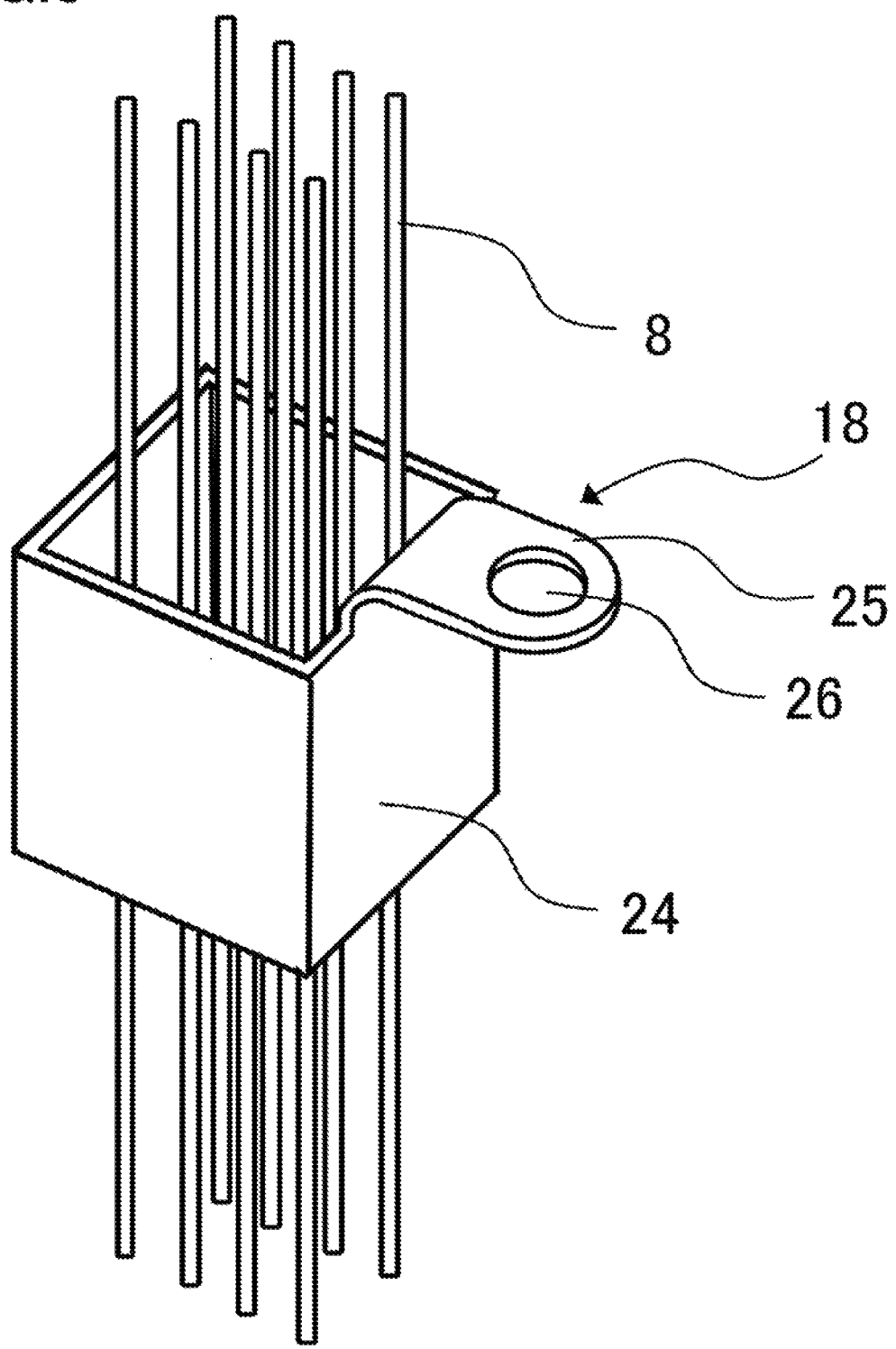
FIG. 8 is a perspective view of a pin header of an electric-power conversion apparatus according to Embodiment 2, at a time before the pin header is insert-molded.

FIG. 6 is a top view of the electric-power conversion apparatus 100 according to Embodiment 1, at a time before the first control circuit board 14 is provided; FIG. 8 is a top view of the electric-power conversion apparatus 100 according to Embodiment 1, at a time after the first control circuit board 14 has been provided. FIG. 7 illustrates a state where the pin header 7 is seen through.

The pin header 7 is provided in the area of the first control circuit board 14, so that the pin header 7 can be prevented from existing out of the first control circuit board 14. Accordingly, the component arrangement can be restricted within the area of the first control circuit board 14; thus, disposing the pin header 7 within the area of the first control circuit board 14 can contribute to downsizing of the electric-power conversion apparatus 100. Although not illustrated in FIGS. 6 and 7, the same thing can be applied to the second control circuit board 15. Accordingly, disposing the pin header 7 within the area where the first control circuit board 14 and the second control circuit board 15 overlap each other can contribute to downsizing the electric-power conversion apparatus 100. It is significant that there is adopted a layout in which when the first control circuit board 14 and the second control circuit board 15 are projected from the respective electronic-component mounting surfaces (the top surface and the bottom surface, respectively), the pin header 7 falls within the projection area where the first control circuit board 14 and the second control circuit board 15 overlap each other.

Here, an example of the manufacturing process for the electric-power conversion apparatus 100 will be explained with reference to FIGS. 2 and 4. At first, the cooling device base portion 3 is provided. Next, the base 2 is mounted on the cooling device base portion 3 and then FSW is applied to the bonding portion 4, so that the cooling device 1 is formed. Next, the first semiconductor module 11 and the second semiconductor module 12 are mounted on the respective surfaces of the cooling device 1. Next, the pin header 7 is made to penetrate the hole 22 in the cooling device 1 and then is fixed to the cooling device 1 with the screw 10. Next, through the intermediary of a resin terminal platform 6, the first control circuit board 14 is disposed on the top portion of the first semiconductor module 11 mounted on the top surface of the base 2; through the intermediary of a resin terminal platform 16, the second control circuit board 15 is disposed on the bottom portion of the second semiconductor module 12 mounted on the bottom surface of the cooling device base portion 3. Next, soldering with the solder 17 is applied to the first connection terminal 11b of the first semiconductor module 11 and the second connection terminal 12b of the second semiconductor module 12 that penetrate the first control circuit board 14 and the second control circuit board 15, respectively, and to the connection pin 8 of the pin header 7 that penetrates the first control circuit board 14 and the second control circuit board 15. With regard to the soldering in the present embodiment, collective soldering connection through the partial jet soldering method is assumed. As a result, the configuration of the electric-power conversion apparatus 100 can be obtained.

Effect of Embodiment 1

(a) The electric-power conversion apparatus 100 according to Embodiment 1 includes the cooling device 1 having the top surface of the base 2, which is a first surface, the bottom surface of the cooling device base portion 3, which is a second surface opposite to the first surface, and the hole 22 that penetrates a portion between the first surface and the second surface, the first control circuit board 14 provided at the first surface side of the cooling device 1, the second control circuit board 15 provided at the second surface side of the cooling device 1, and the pin header 7 having the connection pin 8 that penetrates the hole 22 so as to connect the first control circuit board 14 with the second control circuit board 15 and the mold portion 9 that is fixed to the cooling device 1 and partially wraps the connection pin 8.

Because the pin header 7 connects the first control circuit board 14 with the second control circuit board 15, the electric-power conversion apparatus 100 can be downsized in comparison with the case where the connection between the first control circuit board 14 and the second control circuit board 15 is performed by use of a connector and a wire harness; thus, the working efficiency in the assembly is raised and the cost can be reduced.

Moreover, in comparison with the case where the connection is performed by use of a board-to-board connector, a change in the distance between the first control circuit board 14 and the second control circuit board 15 can be dealt with; thus, in the case where the distance is large, an effect of variation is not likely to be provided and hence the working efficiency in the assembly is also raised.

(b) Furthermore, the electric-power conversion apparatus 100 according to Embodiment 1 has the first semiconductor module 11 provided between the top surface of the base 2, which is the first surface of the cooling device 1, and the first control circuit board 14; the first semiconductor module 11 includes the first main body 11a and the first connection terminal 11b that extends from the first main body 11a toward the first control circuit board 14 so as to be connected with the first control circuit board 14; the tip portion, at the first control circuit board 14 side, of the connection pin 8 and the tip portion of the first connection terminal 11b are arranged on one and the same plane parallel to the first control circuit board 14.

The arrangement described above facilitates insertion of the connection pin 8, at the first control circuit board 14 side, of the pin header 7 and the first connection terminal 11b of the first semiconductor module 11 into the respective through-holes in the first control circuit board 14; thus, the insertion process can be performed by a single movement and hence the assembly time can be shortened.

(c) Moreover, in the electric-power conversion apparatus 100 according to Embodiment 1, the tip portion, at the first control circuit board 14 side, of the connection pin 8 and the tip portion of the first connection terminal 11b are connected with the first control circuit board 14 by use of the solder 17 in such a way as to penetrate the first control circuit board 14.

Accordingly, each of the connection pin 8 of the pin header 7 and the first connection terminal 11b of the first semiconductor module 11 is securely connected and fixed; thus, the reliability can be raised at low cost.

(d) Moreover, the electric-power conversion apparatus 100 according to Embodiment 1 has the second semiconductor module 12 provided between the bottom surface of the cooling device base portion 3, which is the second surface of the cooling device 1, and the second control circuit board 15; the second semiconductor module 12 includes the second main body 12a and the second connection terminal 12b that extends from the second main body 12a toward the second control circuit board 15 so as to be connected with the second control circuit board 15; the tip portion, at the second control circuit board 15 side, of the connection pin 8 and the tip portion of the second connection terminal 12b are arranged on one and the same plane parallel to the second control circuit board 15.

Accordingly, the tip portion, at the second control circuit board 15 side, of the connection pin 8 and the tip portion of the second connection terminal 12b of the second semiconductor module 12 are readily inserted into respective through-holes in the second control circuit board 15; thus, the insertion process can be performed by a single movement and hence the assembly time can be shortened.

(e) Moreover, in the electric-power conversion apparatus 100 according to Embodiment 1, the tip portion, at the second control circuit board 15 side, of the connection pin 8 and the tip portion of the second connection terminal 12b are connected with the second control circuit board 15 by use of the solder 17 in such a way as to penetrate the second control circuit board 15.

Accordingly, each of the connection pin 8 of the pin header 7 and the second connection terminal 12b of the second semiconductor module 12 is securely connected and fixed; thus, the reliability can be raised at low cost.

(f) Moreover, in the electric-power conversion apparatus 100 according to Embodiment 1, the mold portion 9 of the pin header 7 has the mold flange portion 28, and the pin header 7 is fixed to the cooling device 1 through the intermediary of the mold flange portion 28.

Accordingly, it is made possible to accurately provide the pin header 7 in the cooling device 1; thus, the assembly efficiency can be raised. Various changes in the distance between the first control circuit board 14 and the second control circuit board 15 and in the number of the connection pins to be used can be dealt with by changing the lengths and the number of the connection pins 8, without changing the respective shapes of the mold flange portion 28 and the installation accepting portion, for the mold flange portion 28, of the cooling device 1.

(g) Moreover, in the electric-power conversion apparatus 100 according to Embodiment 1, the mold portion 28 of the pin header 7 has the mold protrusion 19, which is in the shape of a protrusion, or a mold positioning portion, which is in the shape of a hole, and the pin header 7 is positioned through the intermediary of the mold positioning portion.

Because the mold protrusion 19 or the positioning hole is provided in the mold flange portion 28, the positioning can accurately and readily be performed. Because the respective positons of the pin header 7 and the cooling device 1 are accurately set, the connection pin 8 of the pin header 7 can readily be connected with the first control circuit board 14 and the second control circuit board 15.

(h) Moreover, in the electric-power conversion apparatus 100 according to Embodiment 1, with regard to the first linear-expansion coefficient $\alpha 1$, which is the linear-expansion coefficient of the connection pin 8, the second linear-expansion coefficient $\alpha 2$, which is the linear-expansion coefficient of the mold portion 9, and the third linear-expansion coefficient $\alpha 3$, which is the linear-expansion coefficient of the cooling device 1, each of a first ratio $\alpha 1/\alpha 2$, which is the ratio of the first linear-expansion coefficient $\alpha 1$ to the second linear-expansion coefficient $\alpha 2$, and a second ratio $\alpha 2/\alpha 3$, which is the ratio of the second linear-expansion coefficient $\alpha 2$ to the third linear-expansion coefficient $\alpha 3$, is within a predetermined range (from 0.8 to 1.2).

Accordingly, thermal stress caused by a temperature change can be prevented from deteriorating the pin header 7 and the connection portion of the control circuit board.

(i) Moreover, in the electric-power conversion apparatus 100 according to Embodiment 1, the pin header 7 is disposed within the area where the first control circuit board 14 and the second control circuit board 15 overlap each other.

Accordingly, the component arrangement can be restricted to be within the area of the control circuit board; thus, this method of disposing the pin header 7 can contribute to downsizing the electric-power conversion apparatus 100.

2. Embodiment 2

Figure 9:
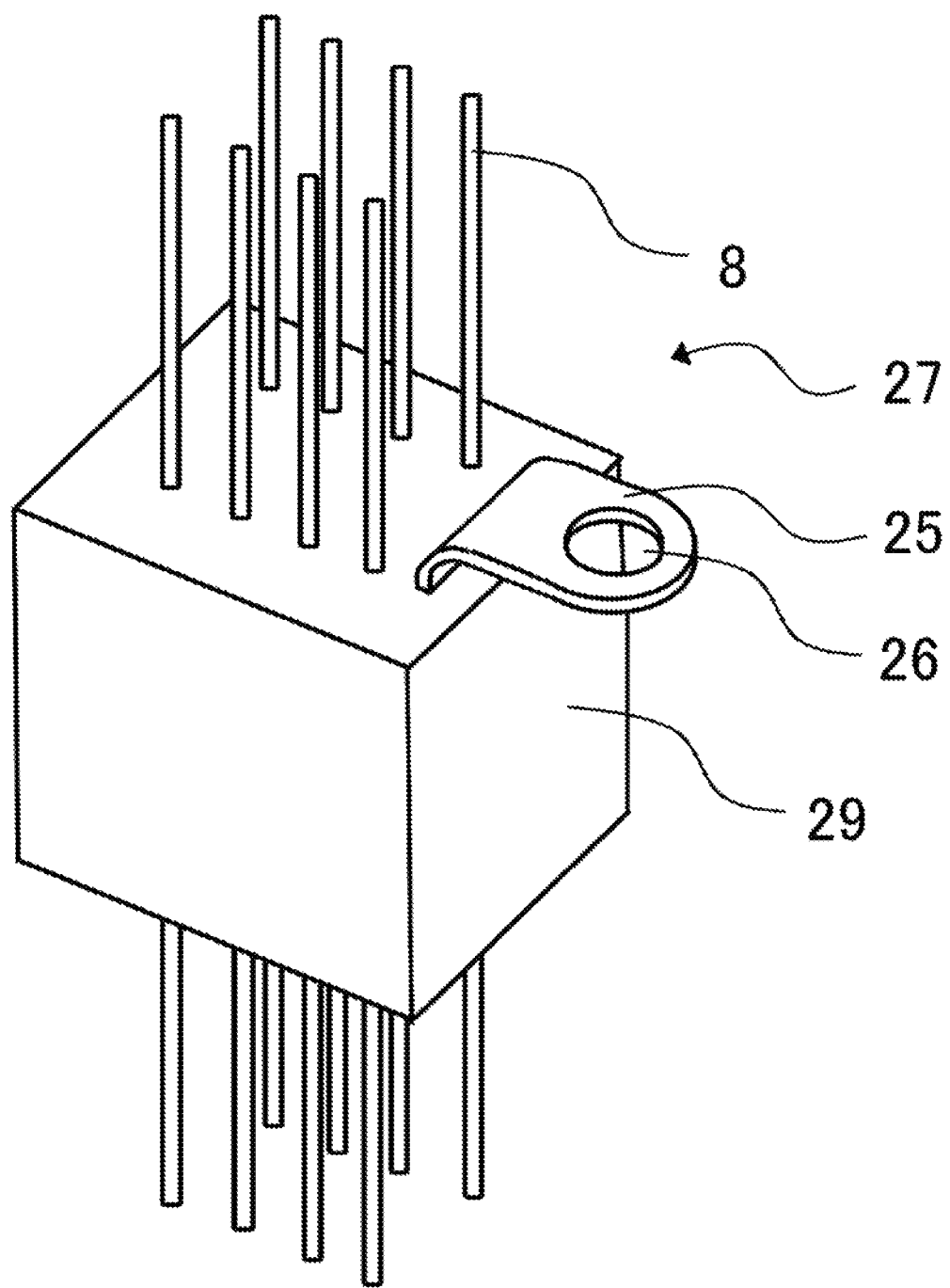
FIG. 9 is a perspective view of a pin header of the electric-power conversion apparatus according to Embodiment 2, at a time after the pin header has been insert-molded.
Figure 10:
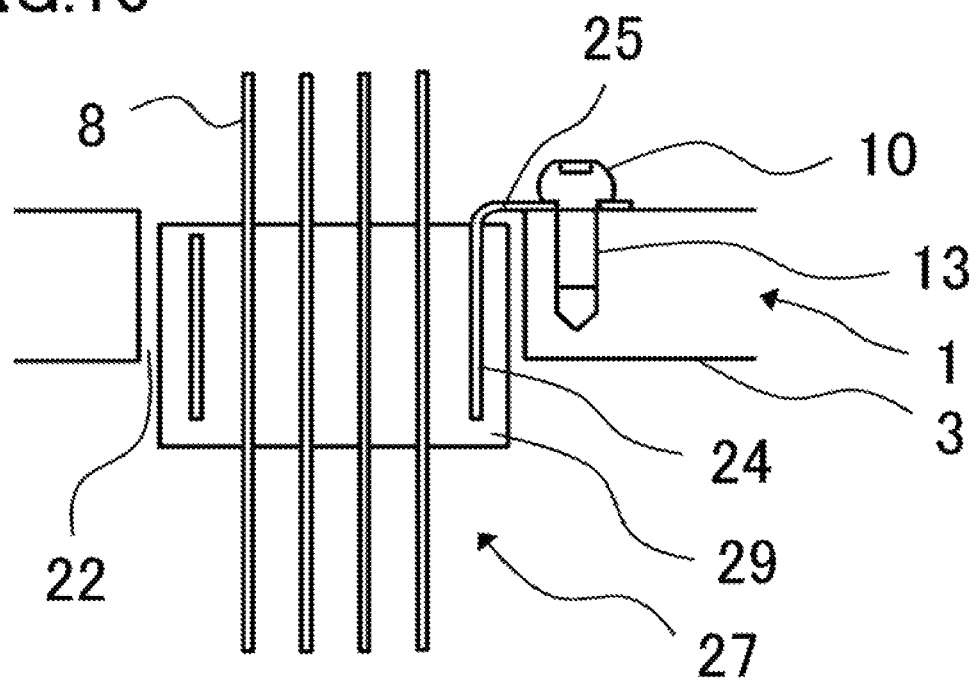
FIG. 10 is a cross-sectional view illustrating a state where the pin header of the electric-power conversion apparatus according to Embodiment 2 is mounted in a cooling device.

FIG. 8 is a perspective view of a pin header 27 of an electric-power conversion apparatus 100 according to Embodiment 2, at a time before the pin header 27 is insert-molded. FIG. 9 is a perspective view of the pin header 27 of the electric-power conversion apparatus 100 according to Embodiment 2, at a time after the pin header 27 has been insert-molded. FIG. 10 is a cross-sectional view illustrating a state where the pin header 27 of the electric-power conversion apparatus 100 according to Embodiment 2 is mounted in the cooling device 1. Hereinafter, Embodiment 2 will be explained with reference to FIGS. 8 through 10.

Embodiment 2 is different from Embodiment 1 only in that the structure of the pin header 27 is changed. The difference between Embodiment 1 and Embodiment 2 is as follows: in Embodiment 1, the mold flange portion 28 is provided in order to mount the pin header 7 in the cooling device 1; however, in Embodiment 2, part of a metal portion 18 is utilized as a flange portion 25 for mounting in the cooling device 1, and a shield 24 is formed of the metal portion 18.

In Embodiment 2, mounting of the pin header 27 in the cooling device 1 is performed by use of the flange portion 25 formed of part of the metal portion 18. As illustrated in FIG. 8, molding is performed by inserting resin around the connection pin 8 and the metal portion 18 fixed at the respective predetermined positions in a die, so that the pin header 27 is produced. FIG. 9 illustrates the state at a time after the molding has been performed by inserting the resin.

FIG. 10 illustrates a cross-sectional view of the pin header 27 that has been produced in such a manner as described above and mounted in the cooling device 1. The screw 10 is inserted into a mounting hole 26 in the flange portion 25 extending from a mold portion 29 and is screwed into the screw hole 13 in the cooling device 1, so that the pin header 27 is fixed to the cooling device 1. In this situation, the flange portion 25 makes contact with the cooling device 1 and the flange portion 25 is connected with the screw hole 13 through the intermediary of the screw 10, so that the metal portion 18 of the pin header 27 is connected with the cooling device 1.

Because the flange portion 25 makes it possible to accurately provide the pin header 27 in the cooling device 1, the assembly efficiency of each of the first control circuit board 14 and the second control circuit board 15 can be raised. Moreover, it is also advantageous that because the pin header 27 is fixed to the cooling device 1 through the intermediary of the flange portion 25, various changes in the distance between the first control circuit board 14 and the second control circuit board 15 and in the number of the connection pins 8 to be used can be dealt with by changing the lengths and the number of the connection pins 8, without changing the respective shapes of the flange portion 25 and the installation accepting portion, for the flange portion 25, of the cooling device 1.

The metal portion 18 incorporated in the pin header 27 is connected with the cooling device 1, so that the pin header 27 is cooled by the cooling device 1. In the case where the connection pin 8 connected with the first control circuit board 14 and the second control circuit board 15 generates heat, an effect that the connection pin 8 is cooled by the metal portion 18 is provided. Moreover, because the metal portion 18 and the cooling device 1 are electrically connected with each other, the impedance of the pin header 27 decreases and hence the noise immunity is raised.

As illustrated in FIG. 8, the metal portion 18 incorporated in the pin header 27 is provided around the connection pin 8, so that the metal portion 18 plays a role of the shield 24. The shield 24 in low-impedance conduction with the cooling device 1 can reduce the effect of external noise to be provided to a signal that passes through the connection pin 8.

It may be allowed that a protrusion (unillustrated) similar to the mold protrusion 19 of the pin header 7 illustrated in FIG. 3 in Embodiment 1 is provided in the flange portion 25, which is part of the metal portion 18. The protrusion in the flange portion 25 is inserted into the positioning hole in the cooling device 1, so that the pin header 27 can be fixed within a prescribed dimension-variation range. In addition, as the positioning mechanism for the pin header 27, it may be allowed that a positioning hole is provided in the flange portion 25 and a positioning protrusion is provided in the cooling device 1. Moreover, the positioning of the pin header 27 can be performed by means of the mounting hole 26 provided in the flange portion 25 and the screw hole 13 of the cooling device 1. Because these positioning methods make it possible to accurately fix the pin header 27 to the cooling device 1, the connection pin 8 of the pin header 27 is readily connected with the first control circuit board 14 and the second control circuit board 15; thus, the assembly efficiency is raised.

In FIGS. 8 and 9, there has been described an example in which part of the metal portion 18 forms the flange portion 25; however, it may be allowed that as is the case with Embodiment 1 illustrated in FIG. 3, the mold flange portion 28 is provided and that the flange portion 25, which is part of the metal portion 18, extends on the top surface or the bottom surface of the mold flange portion 28. The mold flange portion 28 makes it possible to fix the pin header 27 to the cooling device 1 in a high-rigidity manner. Concurrently, the screw 10 electrically connects the metal portion 18 with the cooling device 1, so that the shield 24 in low-impedance conduction with the cooling device 1 can reduce the effect of external noise to be provided to a signal that passes through the connection pin 8.

Effect of Embodiment 2

(j) The electric-power conversion apparatus 100 according to Embodiment 2 has a metal portion at which the pin header 27 is connected with the cooling device 1.

Accordingly, the pin header 27 is cooled by the cooling device 1. Moreover, because the metal portion 18 and the cooling device 1 are electrically connected with each other, the impedance of the pin header 27 decreases and hence the noise immunity is raised.

(k) Moreover, in the electric-power conversion apparatus 100 according to Embodiment 2, the metal portion 18 of the pin header 27 forms the shield 24 around the connection pin 8.

The shield 24 in low-impedance conduction with the cooling device 1 can reduce the effect of external noise to be provided to a signal that passes through the connection pin 8.

(l) Moreover, in the electric-power conversion apparatus 100 according to Embodiment 2, the metal portion 18 of the pin header 27 has the flange portion 25, and the pin header 27 is fixed to the cooling device 1 through the intermediary of the flange portion 25.

Because the flange portion 25 makes it possible to accurately provide the pin header 27 in the cooling device 1, the assembly efficiency of each of the first control circuit board 14 and the second control circuit board 15 can be raised. Moreover, it is also advantageous that various changes in the distance between the first control circuit board 14 and the second control circuit board 15 and in the number of the connection pins 8 to be used can be dealt with by changing the lengths and the number of the connection pins 8, without changing the respective shapes of the flange portion 25 and the installation accepting portion, for the flange portion 25, of the cooling device 1.

(m) Moreover, in the electric-power conversion apparatus 100 according to Embodiment 2, the flange portion 25 has a positioning portion in the shape of a protrusion or a hole, and the pin header 27 is positioned through the intermediary of the positioning portion.

The protrusion in the flange portion 25 is inserted into the positioning hole in the cooling device 1, so that the pin header 27 can be fixed within a prescribed dimension-variation range. In addition, when as the positioning mechanism for the pin header 27, a positioning hole is provided in the flange portion 25 and a positioning protrusion is provided in the cooling device 1, the same effect can be obtained. Because these positioning methods make it possible to accurately fix the pin header 27 to the cooling device 1, the connection pin 8 of the pin header 27 is readily connected with the first control circuit board 14 and the second control circuit board 15; thus, the assembly efficiency is raised.

3. Embodiment 3

Figure 11:
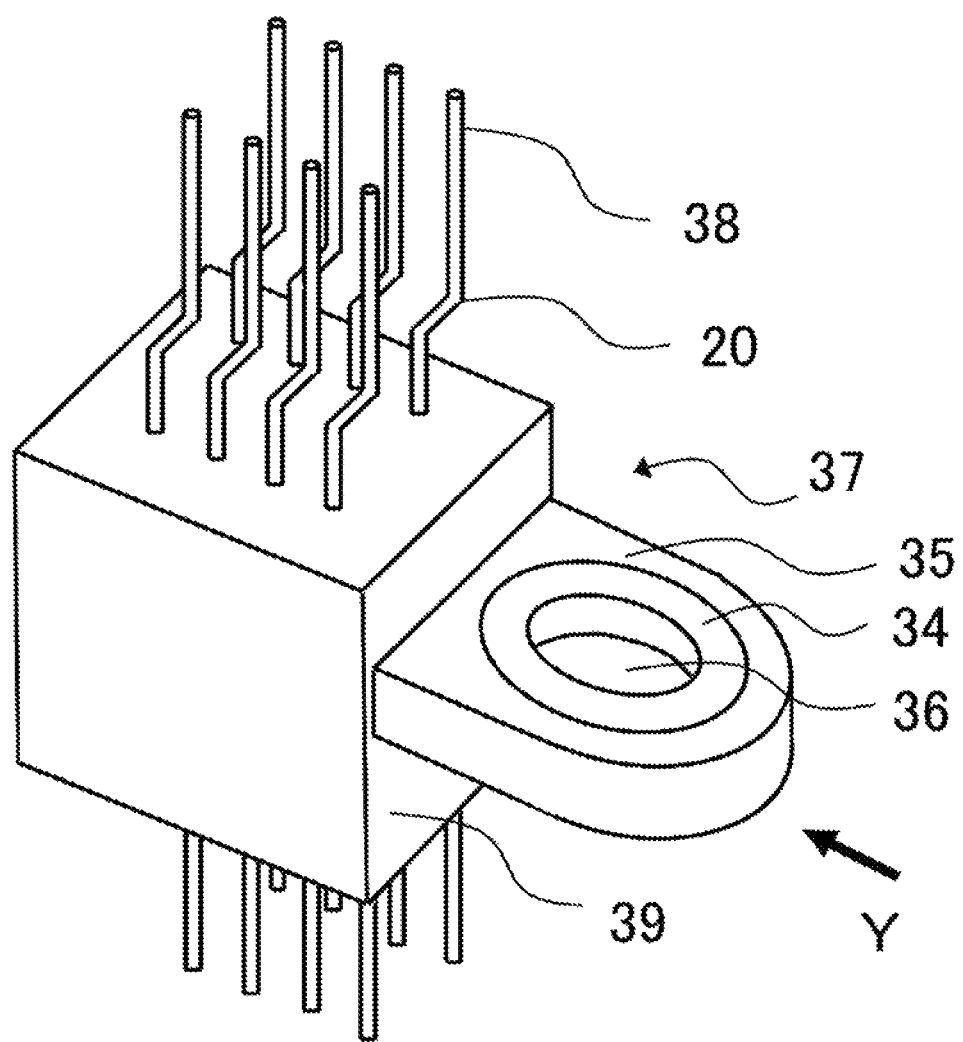
FIG. 11 is a perspective view of a pin header of an electric-power conversion apparatus according to Embodiment 3.
Figure 12:
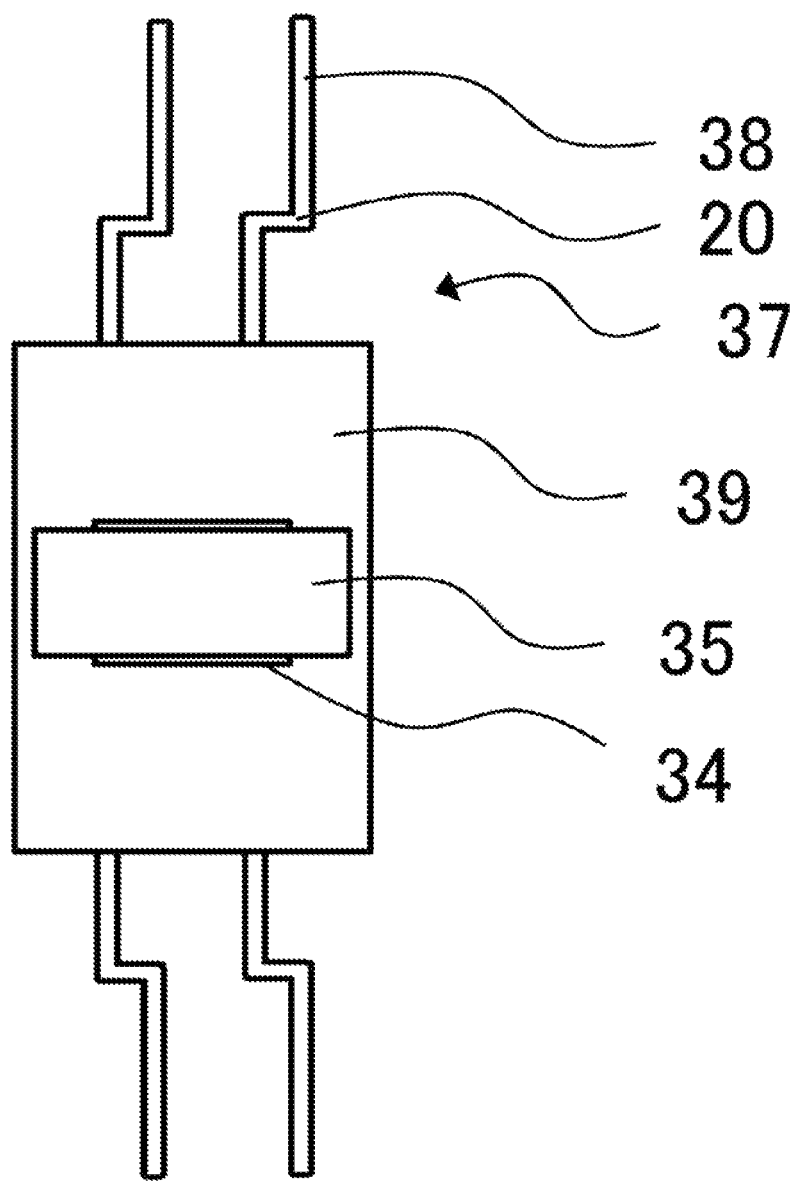
FIG. 12 is a side view of the pin header of the electric-power conversion apparatus according to Embodiment 3.

FIG. 11 is a perspective view of a pin header 37 in an electric-power conversion apparatus 100 according to Embodiment 3. FIG. 12 is a side view of the pin header 37 in the electric-power conversion apparatus 100 according to Embodiment 3. The side direction is indicated by an arrow Y in FIG. 11. Hereinafter, Embodiment 3 will be explained with reference to FIGS. 11 and 12.

Embodiment 3 is different from Embodiment 1 only in that the structure of the pin header 37 is changed. The pin header 37 is different from the pin header 7 according to Embodiment 1 in that a connection pin 38 has a bending portion 20 therein outside a mold portion 39. In addition, the pin header 37 is different from the pin header 7 according to Embodiment 1 in that a mold flange portion 35, which is part of the mold portion 39, is provided not at the top end but at the middle portion of the mold portion 39.

When a vehicle travels, vibration of the vehicle body occurs. Due to the vibration of the vehicle body, the electric-power conversion apparatus is vibrated. In this situation, because the first control circuit board 14, the second control circuit board 15, and the cooling device 1 that each have mass are vibrated, stresses are applied to the respective connection portions, at which the first control circuit board 14 and the connection pin 38 of the pin header 37 are connected with the solder 17 and at which the second control circuit board 15 and the connection pin 38 are connected with the solder 17; therefore, the soldering portions may be deteriorated. In order to prevent the deterioration, the bending portion 20 is provided in the connection pin 38. The provision of the bending portion 20 makes it possible that in the case where compression stress or tensile stress is applied to the connection pin 38, a spring effect of the bending portion 20 absorbs the stress; therefore, it is made possible to reduce the stress applied to the soldering portion and to prevent the soldering portion from being deteriorated.

The mold flange portion 35 of the pin header 37 in each of FIGS. 11 and 12 extends from the middle portion of the mold portion 39. This structure makes it possible to fix the pin header 37 at the middle portion of the hole 22 in the cooling device 1. In FIG. 11, an insertion bush 34 is provided in a mold mounting hole 36 of the mold flange portion 35. Although utilized in order to reinforce the mold mounting hole 36 and to raise the accuracy, the insertion bush 34 is utilized also for the purpose of raising the noise immunity of a signal passing through the connection pin 38, in such a way that in the case where the pin header 37 includes the shield 24 in the mold portion 39, the shield 24 and the insertion bush 34 are connected with each other by means of metal so that the shield 24 can be electrically connected with the cooling device 1 through the intermediary of the screw 10.

Effect of Embodiment 3

(n) In the electric-power conversion apparatus 100 according to Embodiment 3, the connection pin 38 has the bending portion 20 therein outside the mold portion 39.

The provision of the bending portion 20 makes it possible that in the case where compression stress or tensile stress is applied to the connection pin 38, a spring effect of the bending portion 20 absorbs the stress; therefore, it is made possible to reduce the stress applied to the soldering portion and to prevent the soldering portion from being deteriorated.

Although the present application is described above in terms of various exemplary embodiments and implementations, it should be understood that the various features, aspects and functions described in one or more of the individual embodiments are not limited in their applicability to the particular embodiment with which they are described, but instead can be applied, alone or in various combinations to one or more of the embodiments. Therefore, an infinite number of unexemplified variant examples are conceivable within the range of the technology disclosed in the present disclosure. For example, there are included the case where at least one constituent element is modified, added, or omitted and the case where at least one constituent element is extracted and then combined with constituent elements of other embodiments.

What is claimed is:

1. An electric-power conversion apparatus comprising:
    a cooling device having a first surface, a second surface opposite to the first surface, and a hole that penetrates a portion thereof between the first surface side and the second surface side;
    a first control circuit board provided at the first surface side of the cooling device;
    a second control circuit board provided at the second surface side of the cooling device; and
    a pin header having a connection pin that penetrates the hole so as to connect the first control circuit board with the second control circuit board and a mold portion that is fixed to the cooling device and partially wraps the connection pin.

2. The electric-power conversion apparatus according to claim 1, comprising a first semiconductor module provided between the first surface of the cooling device and the first control circuit board,
    wherein the first semiconductor module includes a first main body and a first connection terminal that extends from the first main body toward the first control circuit board so as to be connected with the first control circuit board, and
    wherein a tip portion, at the first control circuit board side, of the connection pin and a tip portion of the first connection terminal are arranged on one and the same plane parallel to the first control circuit board.

3. The electric-power conversion apparatus according to claim 2, wherein the tip portion, at the first control circuit board side, of the connection pin and the tip portion of the first connection terminal are connected with the first control circuit board through soldering in such a way as to penetrate the first control circuit board.

4. The electric-power conversion apparatus according to claim 2, comprising a second semiconductor module provided between the second surface of the cooling device and the second control circuit board,
    wherein the second semiconductor module includes a second main body and a second connection terminal that extends from the second main body toward the second control circuit board so as to be connected with the second control circuit board, and
    wherein a tip portion, at the second control circuit board side, of the connection pin and a tip portion of the second connection terminal are arranged on one and the same plane parallel to the second control circuit board.

5. The electric-power conversion apparatus according to claim 4, wherein the tip portion, at the second control circuit board side, of the connection pin and the tip portion of the second connection terminal are connected with the second control circuit board through soldering in such a way as to penetrate the second control circuit board.

6. The electric-power conversion apparatus according to claim 1, wherein the pin header has a metal portion connected with the cooling device.

7. The electric-power conversion apparatus according to claim 6, wherein the metal portion forms a shield around the connection pin.

8. The electric-power conversion apparatus according to claim 6, wherein the metal portion has a flange portion, and the pin header is fixed to the cooling device through the intermediary of the flange portion.

9. The electric-power conversion apparatus according to claim 8, wherein the flange portion has a positioning portion in the shape of a protrusion or a hole, and the pin header is positioned through the intermediary of the positioning portion.

10. The electric-power conversion apparatus according to claim 1, wherein the mold portion has a mold flange portion, and the pin header is fixed to the cooling device through the intermediary of the mold flange portion.

11. The electric-power conversion apparatus according to claim 10, wherein the mold flange portion has a mold positioning portion in the shape of a protrusion or a hole, and the pin header is positioned through the intermediary of the mold positioning portion.

12. The electric-power conversion apparatus according to claim 1, wherein with regard to a first linear-expansion coefficient, which is the linear-expansion coefficient of the connection pin, a second linear-expansion coefficient, which is the linear-expansion coefficient of the mold portion, and a third linear-expansion coefficient, which is the linear-expansion coefficient of the cooling device, each of a first ratio, which is the ratio of the first linear-expansion coefficient to the second linear-expansion coefficient, and a second ratio, which is the ratio of the second linear-expansion coefficient to the third linear-expansion coefficient, is within a range of 0.8 to 1.2.

13. The electric-power conversion apparatus according to claim 1, wherein the connection pin has a bending portion therein outside the mold portion.

14. The electric-power conversion apparatus according to claim 1, wherein the pin header is disposed within an area where the first control circuit board and the second control circuit board overlap each other.

* * * * *